(12) United States Patent
Okabe

(10) Patent No.: US 11,810,840 B2
(45) Date of Patent: Nov. 7, 2023

(54) SEMICONDUCTOR DEVICE

(71) Applicant: SHINKO ELECTRIC INDUSTRIES CO., LTD., Nagano (JP)

(72) Inventor: Toshiyuki Okabe, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 88 days.

(21) Appl. No.: 17/444,779

(22) Filed: Aug. 10, 2021

(65) Prior Publication Data
US 2022/0059438 A1 Feb. 24, 2022

(30) Foreign Application Priority Data

Aug. 21, 2020 (JP) ................. 2020-140090

(51) Int. Cl.
H01L 23/495 (2006.01)
H01L 23/00 (2006.01)
H01L 25/065 (2023.01)
H01L 23/538 (2006.01)
H01L 23/498 (2006.01)

(52) U.S. Cl.
CPC .. *H01L 23/49531* (2013.01); *H01L 23/49575* (2013.01); *H01L 23/49816* (2013.01); *H01L 23/5386* (2013.01); *H01L 24/32* (2013.01); *H01L 24/48* (2013.01); *H01L 25/0657* (2013.01); *H01L 2224/32245* (2013.01); *H01L 2224/48091* (2013.01); *H01L 2224/48145* (2013.01); *H01L 2924/186* (2013.01)

(58) Field of Classification Search
CPC ..... H01L 24/32; H01L 25/0655; H01L 25/18; H01L 23/3121; H01L 24/97; H01L 2224/73265; H01L 2924/181; H01L 2224/45144; H01L 2224/45147; H01L 25/50; H10B 80/00
USPC ........................................ 257/676
See application file for complete search history.

(56) References Cited

U.S. PATENT DOCUMENTS 7,973,404 B2 * 7/2011 Nishimura .......... H01L 23/3128
257/723
8,404,980 B2 * 3/2013 Nishimura .......... H01L 23/3128
174/255

FOREIGN PATENT DOCUMENTS

JP H05-021480 1/1993

* cited by examiner

*Primary Examiner* — Jasmine J Clark
(74) *Attorney, Agent, or Firm* — IPUSA, PLLC

(57) ABSTRACT

A semiconductor device includes a lead frame having a first principal surface which includes a recess, and a second principal surface opposite to the first principal surface, a relay board, disposed in the recess, and having a third principal surface, and a fourth principal surface opposite to the third principal surface, wherein the fourth principal surface opposes a bottom surface of the recess, a first semiconductor chip disposed on the third principal surface, a first conductive material connecting the lead frame and the relay board, and a second conductive material connecting the relay board and the first semiconductor chip. A distance between the second principal surface and the third principal surface is less than or equal to a distance between the second principal surface and the first principal surface.

20 Claims, 14 Drawing Sheets

FIG.3A
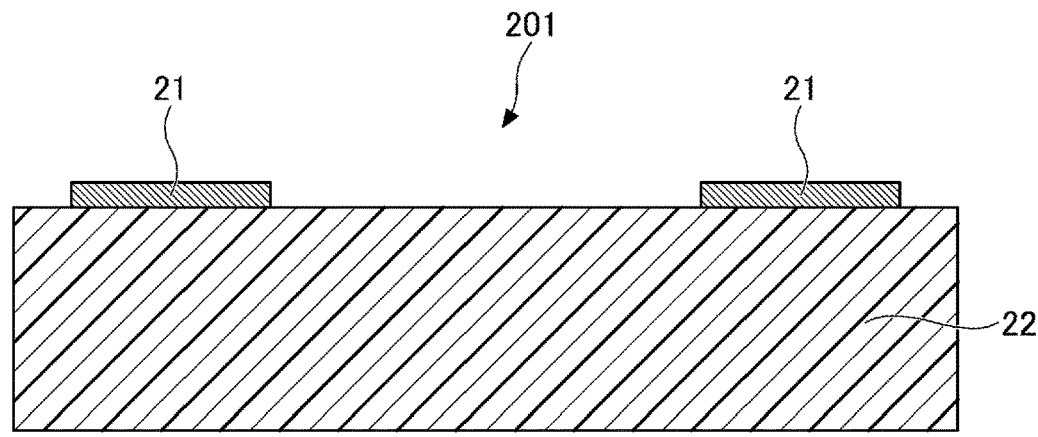
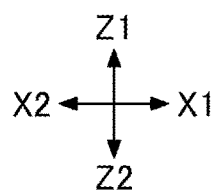
FIG.3B
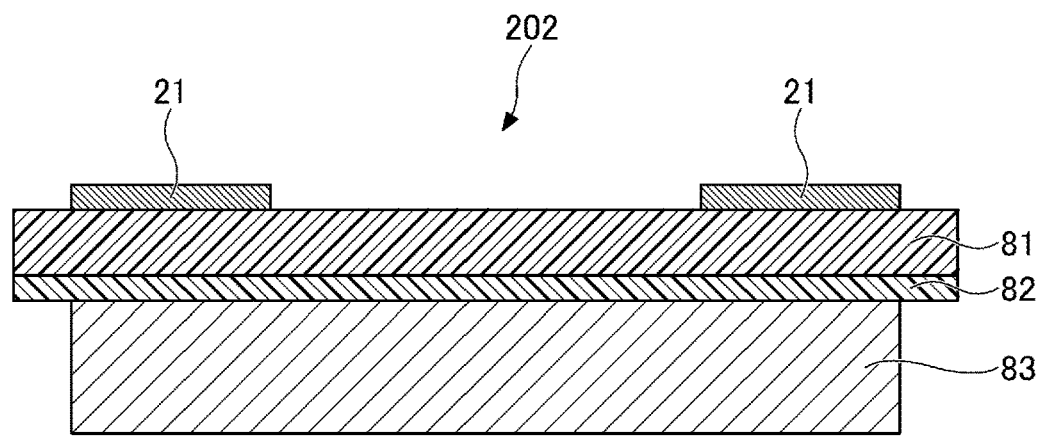
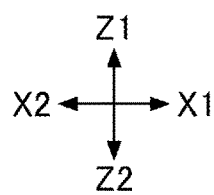

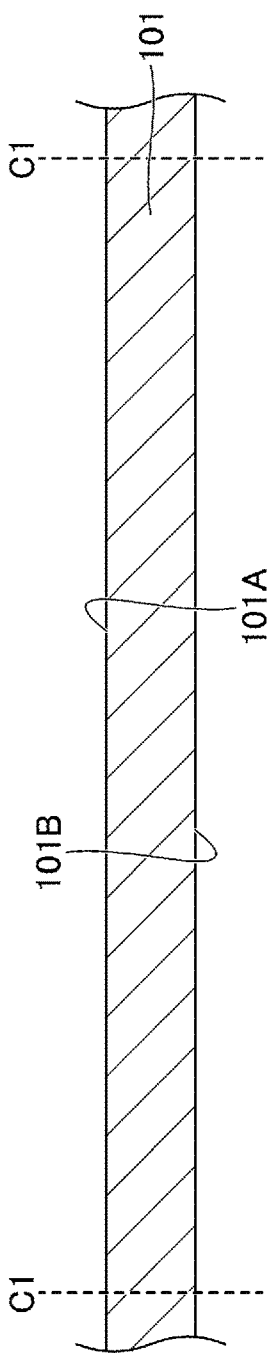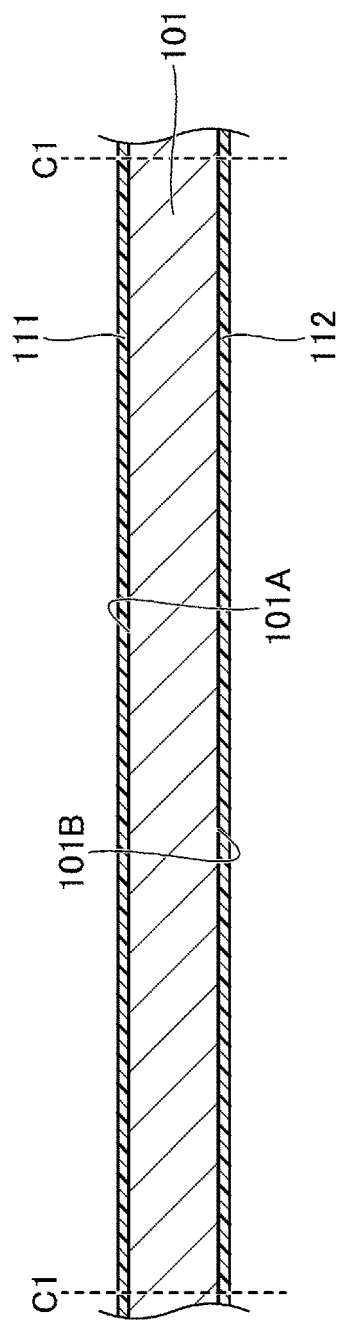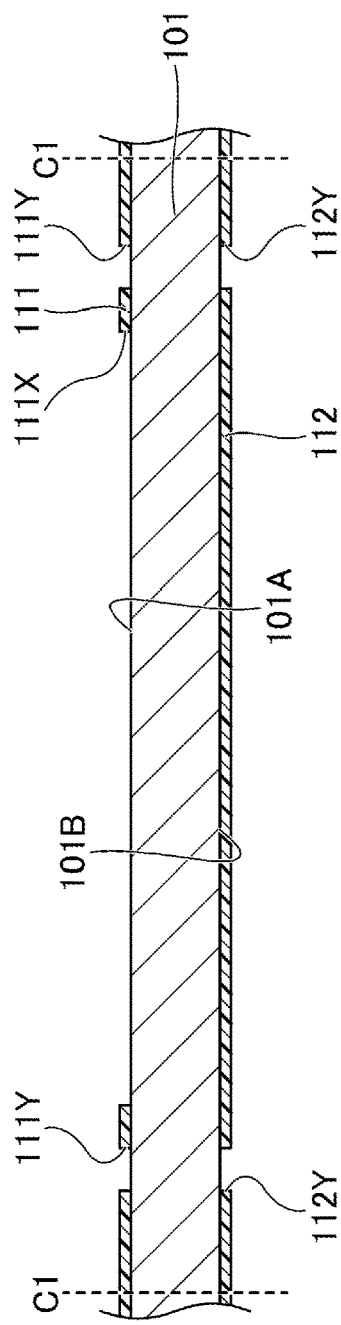

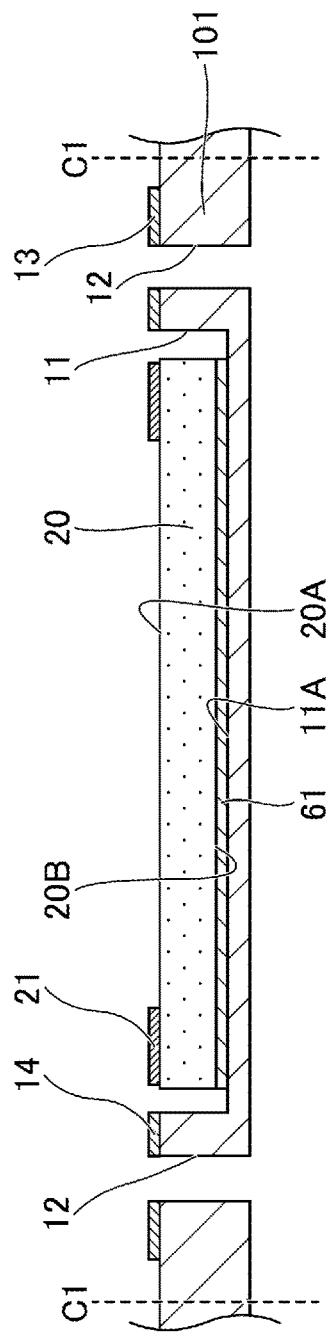
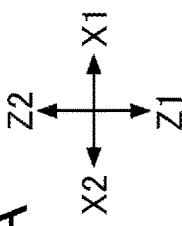
FIG.8A
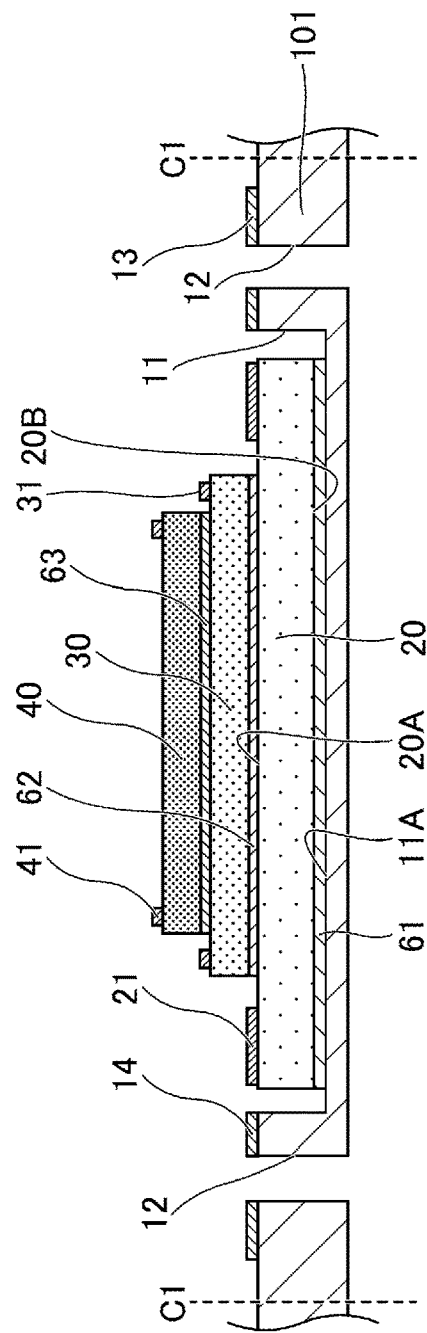
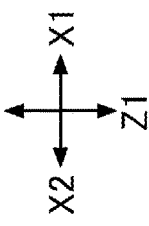
FIG.8B

SEMICONDUCTOR DEVICE

CROSS-REFERENCE TO RELATED APPLICATIONS

This application is based upon and claims priority to Japanese Patent Application No. 2020-140090, filed on Aug. 21, 2020, the entire contents of which are incorporated herein by reference.

FIELD

Certain aspects of the embodiments discussed herein are related to semiconductor devices, and methods for manufacturing the semiconductor devices.

BACKGROUND

A lead frame, having a die pad and a substrate, is proposed in Japanese Laid-Open Patent Publication No. H05-021480, for example. The substrate, to be mounted with a semiconductor element, is provided on the die pad. The semiconductor element is mounted on the substrate.

In semiconductor devices manufactured using conventional lead frames, a short circuit may be generated inside the semiconductor devices.

SUMMARY

Accordingly, it is an object in one aspect of the embodiments to provide a semiconductor device which can reduce a short circuit generated inside, and a method for manufacturing the semiconductor device.

According to one aspect of the embodiments, a semiconductor device includes a lead frame having a first principal surface which includes a recess, and a second principal surface opposite to the first principal surface; a relay board, disposed in the recess, and having a third principal surface, and a fourth principal surface opposite to the third principal surface, wherein the fourth principal surface opposes a bottom surface of the recess; a first semiconductor chip disposed on the third principal surface; a first conductive material connecting the lead frame and the relay board; and a second conductive material connecting the relay board and the first semiconductor chip, wherein a distance between the second principal surface and the third principal surface is less than or equal to a distance between the second principal surface and the first principal surface.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 3A and FIG. 3B are cross sectional views illustrating examples of a relay board.

FIG. 5A, FIG. 5B, and FIG. 5C are cross sectional views (part 1) illustrating a method for manufacturing the semiconductor device according to the first embodiment.

FIG. 8A and FIG. 8B are cross sectional views (part 4) illustrating the method for manufacturing the semiconductor device according to the first embodiment.

DESCRIPTION OF EMBODIMENTS

Figure 1:
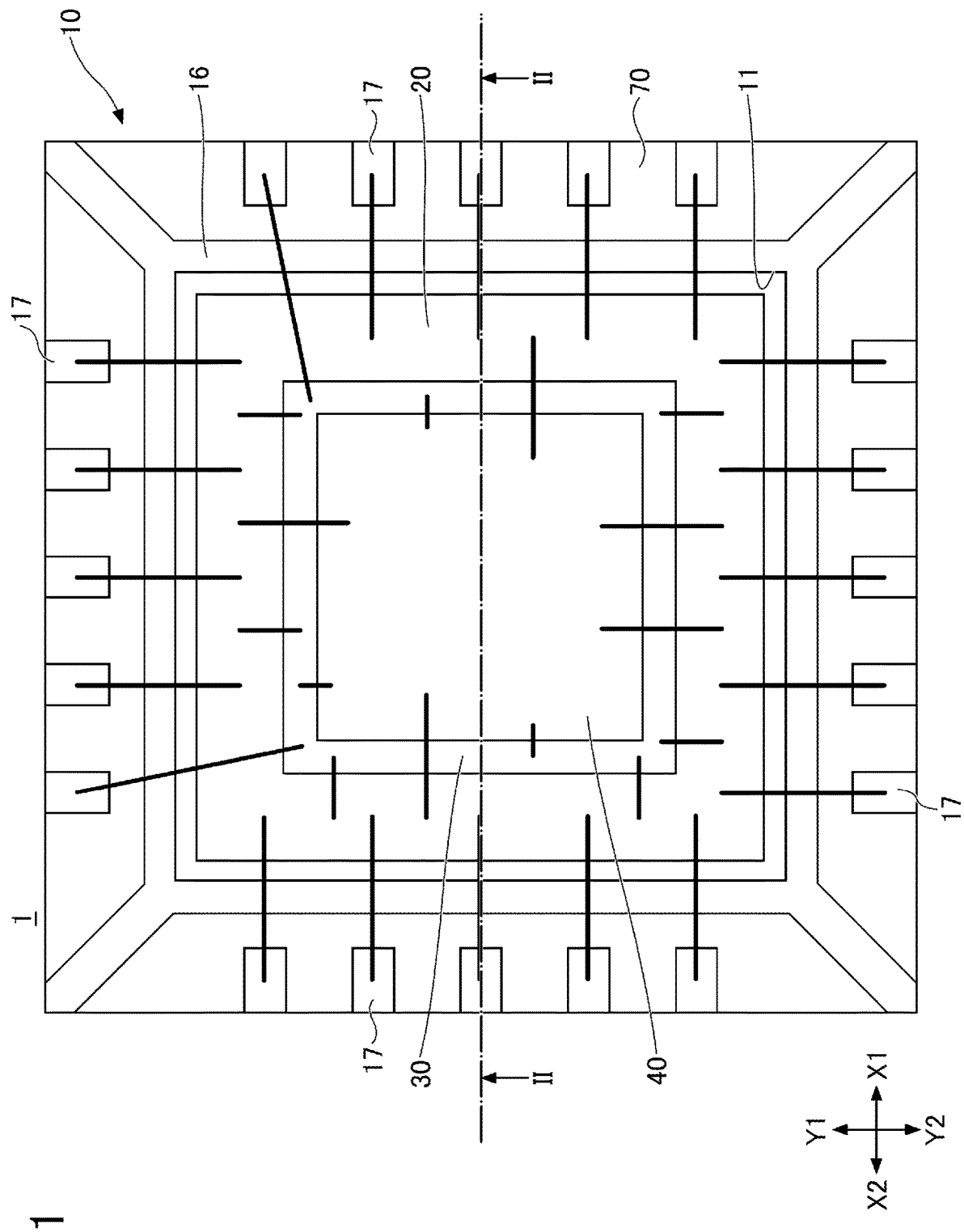
FIG. 1 is a view schematically illustrating a semiconductor device according to a first embodiment.

The present inventor made diligent studies to investigate the cause of the short circuit generated inside the conventional semiconductor device. As a result, the present inventor found that, when performing a resin encapsulation, some bonding wires connecting a lead frame and a semiconductor element move due to pressure from an encapsulating resin and make contact with other bonding wires. The present inventor also found that such movements of the bonding wires are less likely to occur when the bonding wires are shortened.

Preferred embodiments of the present invention will be described with reference to the accompanying drawings. In the drawings, those constituent elements having substantially the same functions or structures are designated by the same reference numerals, and a repeated description of such constituent elements may be omitted. In this disclosure, an X1-X2 direction, a Y1-Y2 direction, and a Z1-Z2 direction are perpendicular to each other. A plane including the X1-X2 direction and the Y1-Y2 direction will be referred to as an XY-plane, a plane including the Y1-Y2 direction and the Z1-Z2 direction will be referred to as a YZ-plane, and a plane including the Z1-Z2 direction and the X1-X2 direction will be referred to as a ZX-plane. For the sake of convenience, the Z1-Z2 direction will be assumed to be an up-and-down direction, or a vertical direction. A plan view of an object refers to a view of the object viewed from the Z1 side toward the Z2 side, that is, in the Z1-Z2 direction. However, the semiconductor device and lead frame may be used in an upside-down state, or may be disposed at an arbitrary angle.

First Embodiment

A first embodiment will be described. The first embodiment relates to a semiconductor device.

[Structure of Semiconductor Device]

Figure 2:
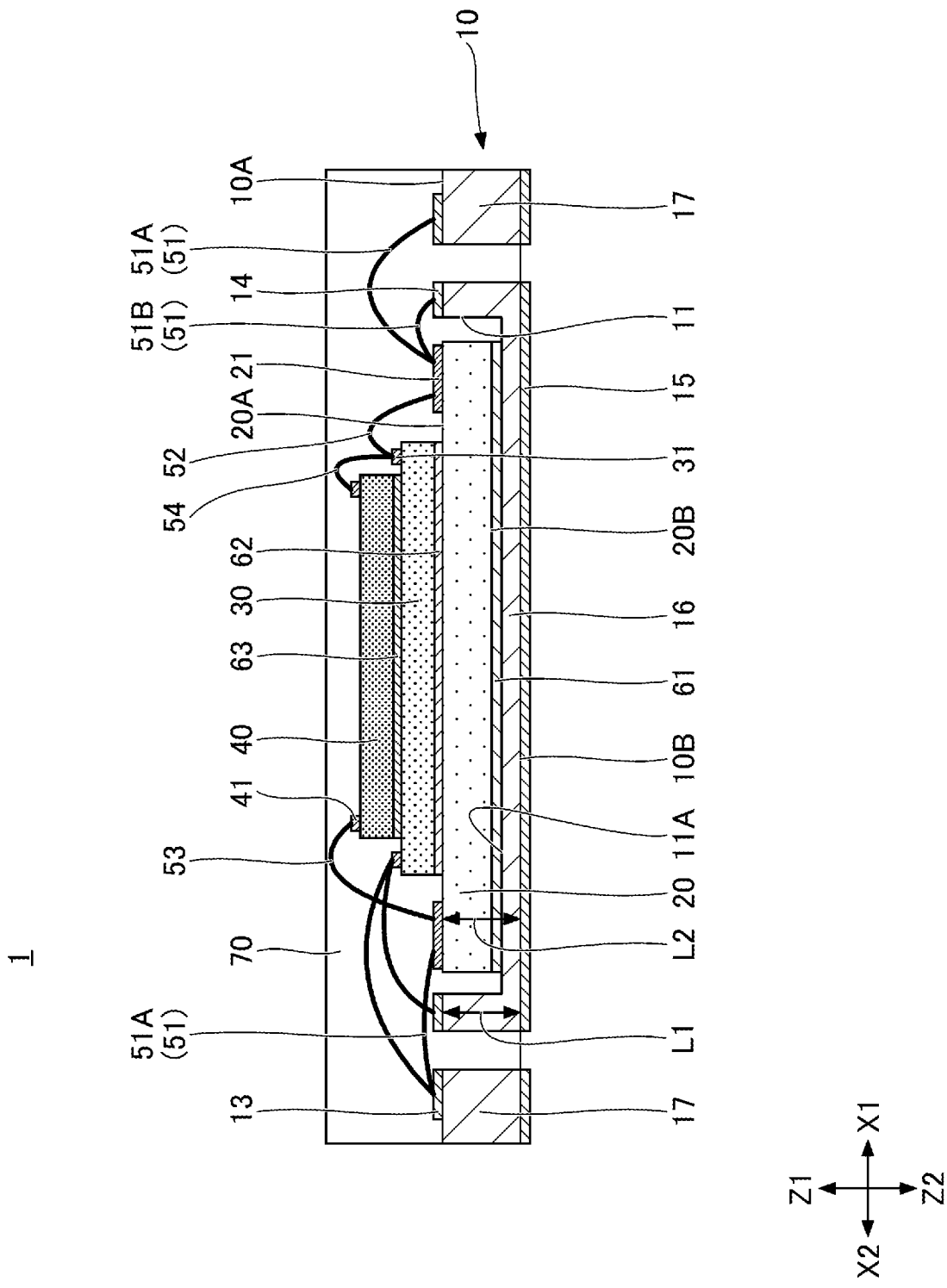
FIG. 2 is a cross sectional view illustrating the semiconductor device according to the first embodiment.

First, a structure of the semiconductor device will be described. FIG. 1 is a view schematically illustrating the semiconductor device according to the first embodiment. FIG. 2 is a cross sectional view illustrating the semiconductor device according to the first embodiment. FIG. 2 is a cross sectional view along a line II-II in FIG. 1.

As illustrated in FIG. 1 and FIG. 2, a semiconductor device 1 according to the first embodiment includes a lead frame 10, a relay board 20, a first semiconductor chip 30, and a second semiconductor chip 40. FIG. 1 illustrates the lead frame 10, the relay board 20, the first semiconductor chip 30, the second semiconductor chip 40, or the like in a perspective through a resin part 70.

The lead frame 10 includes an upper surface 10A, and a lower surface 10B opposite the upper surface 10A. In the plan view, the lead frame 10 has a rectangular die pad 16, and a plurality of leads 17 disposed around the die pad 16. For example, the planar shape of the lead 17 may be rectangular, and the lead 17 may have a cubic shape or a parallelepiped shape. A lower surface of the die pad 16 coincides with lower surfaces of the leads 17. The lower surface of the die pad 16 and the lower surfaces of the leads 17 form the lower surface 10B of lead frame 10. A recess 11 is formed in the upper surface of the die pad 16. A portion of the upper surface of the die pad 16, not famed with the recess 11, coincides with the upper surfaces of the leads 17. The portion of the upper surface of the die pad 16, not formed with the recess 11, and the upper surfaces of the leads 17, form the upper surface 10A of the lead frame 10. A metal film 13 is formed on the upper surface of the lead 17, and a metal film 14 is formed on the upper surface of the die pad 16 around a periphery of the recess 11. A metal film 15 is famed on the lower surfaces of the die pad 16 and the leads 17. In FIG. 1, the illustration of metal films 13 and 14 is omitted.

A material used for the lead frame 10 may be copper (Cu), Cu-based alloys, iron-nickel (Fe—Ni), Fe-Ni-based alloys, stainless steel, or the like, for example. Examples of the metal films 13, 14, and 15 include a Ag film, a Au film, a Ni/Au film (a metal film made up of a Ni film and an Au film laminated in this order from the side closer to the lead frame 10), a Ni/Pd/Au film (a metal film made up of a Ni film, a Pd film, and an Au film laminated in this order from the side closer to the lead frame 10), or the like, for example. A portion of the lead frame 10, not formed with the recess 11, may have a thickness in a range of 150 μm to 300 μm, for example. The recess 11 may have a depth in a range of 100 μm to 250 μm, for example.

The relay board 20 includes an upper surface 20A, and a lower surface 20B opposite the upper surface 20A. The relay board 20 has a thickness, which is smaller than thicknesses of the leads 17, and also smaller than a thickness of a portion of the die pad 16 not formed with the recess 11. The relay board 20 is disposed in the recess 11. The relay board 20 has an interconnect 21 on the upper surface 20A. The relay board 20 is disposed so that the lower surface 20B opposes a bottom surface 11A of the recess 11. The bottom surface 11A and the lower surface 20B are bonded by an adhesive 61. Examples of the adhesive 61 include a die attach film, a Ag paste, or the like, for example. In FIG. 1, the illustration of the interconnect 21 is omitted.

A first semiconductor chip 30 is provided on the upper surface 20A of the relay board 20. The first semiconductor chip 30 has electrodes 31 provided on an upper surface of the first semiconductor chip 30. The upper surface 20A of the relay board 20 and a lower surface of the first semiconductor chip 30 are bonded by an adhesive 62. Examples of the adhesive 62 include a die attach film, a Ag paste, or the like, for example. In FIG. 1, the illustration of the electrode 31 is omitted.

A second semiconductor chip 40 is provided above the first semiconductor chip 30. The second semiconductor chip 40 has electrodes 41 provided on an upper surface of the second semiconductor chip 40. The upper surface of the first semiconductor chip 30 and a lower surface of the second semiconductor chip 40 are bonded by an adhesive 63. Examples of the adhesive 63 include a die attach film, a Ag paste, or the like, for example. In FIG. 1, the illustration of the electrode 41 is omitted.

The semiconductor device 1 includes a first bonding wire 51, a second bonding wire 52, a third bonding wire 53, and a fourth bonding wire 54. The first bonding wire 51 connects the metal film 13 or 14 of the lead frame 10 to the interconnect 21 of the relay board 20. The second bonding wire 52 connects the interconnect 21 of the relay board 20 to the electrode 31 of the first semiconductor chip 30. The third bonding wire 53 connects the interconnect 21 of the relay board 20 to the electrode 41 of the second semiconductor chip 40. The fourth bonding wire 54 connects the electrode 31 of the first semiconductor chip 30 to the electrode 41 of the second semiconductor chip 40. One or more first bonding wires 51 connect the metal film 13 of the lead 17 to the interconnect 21 of the relay board 20, and the other one or more first bonding wires 51 connect the metal film 14 of the die pad 16 to the interconnect 21 of the relay board 20. The semiconductor device 1 may include a bonding wire which connects the metal film 13 or 14 of the lead frame 10 to the electrode 31 of the first semiconductor chip 30. The first bonding wire 51 is an example of a first conductive material, the second bonding wire 52 is an example of a second conductive material, the third bonding wire 53 is an example of a third conductive material, and the fourth bonding wire 54 is an example of a fourth conductive material. For example, metal wires made of copper, gold, or the like, may be used for the bonding wires.

The first bonding wires 51 may include a first bonding wire 51A connecting the metal film 13 of the lead 17 to the interconnect 21 of the relay board 20, and a first bonding wire 51B connecting the metal film 14 of the die pad 16 to the interconnect 21 of the relay board 20, for example. The first bonding wire 51A may be used to transmit a signal, and the first bonding wire 51B may be used to apply a ground potential, for example.

The semiconductor device 1 includes a resin part 70 which encapsulates the relay board 20, the first semiconductor chip 30, the second semiconductor chip 40, the first bonding wire 51, the second bonding wire 52, the third bonding wire 53, and the fourth bonding wire 54. For example, a so-called molded resin or the like, having a filler included in an epoxy resin, may be used for the resin part 70.

The lower surface of the die pad 16 coincides with a lower surface of the resin part 70, and the lower surface of the die pad 16 is exposed at the lower surface of the resin part 70. In addition, the upper and side surfaces of the die pad 16 are covered by resin part 70.

The lower surfaces of the leads 17 coincide with the lower surface of the resin part 70, and the lower surfaces of the leads 17 are exposed at the lower surface of the resin part 70.

In addition, the upper surfaces of the leads 17 are covered by the resin part 70. A first side surface of the lead 17 opposing the die pad 16 is covered by the resin part 70, and a second side surface of the lead 17, opposite to the first side surface, is exposed at a side surface of the resin part 70. Further, a side surface of the lead 17, between the first side surface of the lead 17 opposing the die pad 16, and the second side surface of the lead 17, is covered by the resin part 70.

Next, an example of the relay board 20 will be described. FIG. 3A and FIG. 3B are cross sectional views illustrating examples of the relay board 20.

As illustrated in FIG. 3A, in a relay board 201 according to a first example, the interconnect 21 is formed on an insulating base 22 using a metal, such as copper, copper alloy, or the like, for example. For example, the material used for the base 22 may be a glass epoxy resin. That is, a single-sided wiring board is formed by the base 22 and the interconnect 21. The material used for the base 22 may be selected depending on the application or usage of semiconductor device 1.

As illustrated in FIG. 3B, in a relay board 202 according to a second example, the interconnect 21 is famed on a tape base 81 using a metal, such as copper, copper alloy, or the like, for example. That is, a flexible wiring board, such as a tape automated bonding (TAB) tape or the like, is formed by the tape base 81 and the interconnect 21. The tape base 81 is bonded to a carrier 83 by an adhesive layer 82 provided on a lower surface of the tape base 81. The material used for the tape base 81 may be an insulating resin, such as polyimide or the like, for example. The material used for the carrier 83 may be a metal, such as copper, copper alloy, aluminum, aluminum alloy, or the like, for example. According to this second example, the relay board 202 can be made thin more easily than the first example. The carrier 83 may also function as a heat sink. The material used for the carrier 83 may be an insulator. If the material used for the carrier 83 is electrically conductive, the carrier 83 is preferably positioned on the inner side of an edge of the tape base 81 in the plan view. As will be described later in more detail, this position of the carrier 83 can reduce deterioration of an insulation reliability between the carrier 83 and the interconnect 21 during the manufacture.

The relay board 20 may be a module board, such as a coreless board or the like having a multilayer interconnection structure.

A distance L2 between the lower surface 10B of the lead frame 10 and the upper surface 20A of the relay board 20 is less than or equal to a distance L1 between the lower surface 10B and the upper surface 10A of the lead frame 10. The distance L2 may be equal to the distance L1. The upper surface 10A is an example of a first principal surface, the lower surface 10B is an example of a second principal surface, the upper surface 20A is an example of a third principal surface, and the lower surface 10B is an example of a fourth principal surface.

As described above, in the semiconductor device 1 according to the first embodiment, the relay board 20 is disposed in the recess 11, and the distance L2 between the lower surface 10B of the lead frame 10 and the upper surface 20A of the relay board 20 is less than or equal to the distance L1 between the lower surface 10B and the upper surface 10A of the lead frame 10. In addition, the first semiconductor chip 30 and the second semiconductor chip 40 are also provided on the relay board 20. For this reason, short bonding wires may be used for the bonding wires 51 through 54. For example, if the distance L2 were greater than the distance L1, the first bonding wire 51 connecting the lead frame 10 and the relay board 20 would become long, thereby making it easier for the first bonding wire 51 to move due to the long length thereof. In this first embodiment, because the distance L2 is less than or equal to the distance L1, the movement of the first bonding wire 51 can be restricted and reduced. Moreover, if the lead frame 10 and the second semiconductor chip 40 were to be connected by a single bonding wire, the bonding wire would likely become long. However, in this first embodiment, the lead frame 10 and the second semiconductor chip 40 can be connected to each other via the first bonding wire 51, the interconnect 21, and the third bonding wire 53. For this reason, there is no need to use a bonding wire which is likely to become long, and a short circuit generated inside the semiconductor device 1 can be reduced with ease. The distance L1 includes the thickness of the metal film 14, the distance L2 includes the thickness of the interconnect 21, and the distance L2 may be less than or equal to the distance L1.

Further, because the distance L2 is less than or equal to the distance L1, the thickness (dimensions in the Z1-Z2 direction) of the semiconductor device 1 can be reduced.

[Method for Manufacturing Semiconductor Device]

Figure 4:
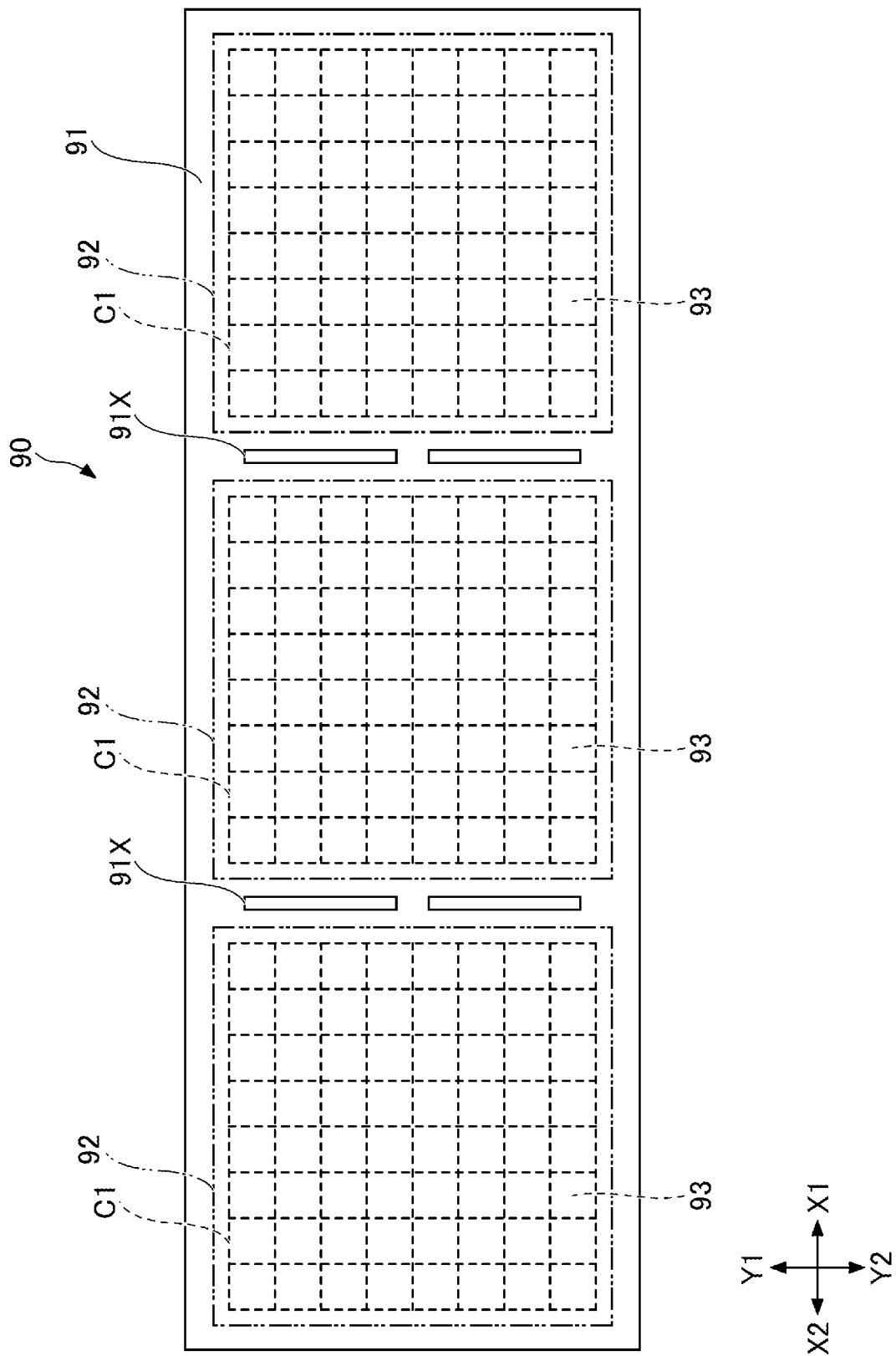
FIG. 4 is a diagram illustrating a layout of a lead frame assembly.

Next, a method for manufacturing the semiconductor device 1 according to the first embodiment will be described. In this method, a lead frame assembly including a plurality of lead frames 10 is formed, and the relay board 20 is thereafter disposed in the recess 11 of the lead frame 10, to provide the first semiconductor chip 30 and the second semiconductor chip 40 on the relay board 20. FIG. 4 is a diagram illustrating a layout of the lead frame assembly. FIG. 5A through FIG. 10B are cross sectional views illustrating the method for manufacturing the semiconductor device 1 according to the first embodiment.

First, a planar structure of a lead frame assembly 90 will be described. As illustrated in FIG. 4, the lead frame assembly 90 has a structure in which lead frame region groups 92, separated from each other, are disposed on a board frame 91 having an approximately rectangular shape in the plan view.

In the example illustrated in FIG. 4, three lead frame region groups 92 are arranged in a single row, but the number of lead frame region groups 92 to be arranged may be arbitrarily determined. Alternatively, the lead frame region groups 92 may be arranged in a plurality of rows. In the example illustrated in FIG. 4, a slit 91X is provided between the adjacent lead frame region groups 92, however, it is not essential to provide the slit 91X.

In the lead frame region group 92, the lead frame regions 93 are arranged in a matrix arrangement. The lead frame region 93 is an area where the first semiconductor chip 30 and the second semiconductor chip 40 are mounted. The lead frame regions 93 are cut along cutting positions C1, thereby becoming individual lead frames 10. In the example illustrated in FIG. 4, the lead frame region group 92 is formed by the lead frame regions 93 arranged in 8 rows and 8 columns. However, the number of the lead frame regions 93 forming the lead frame region group 92 may be arbitrarily determined.

The lead frame assembly 90 has the planar structure described above.

When forming the lead frame assembly 90, a metal plate 101 is first prepared as illustrated in FIG. 5A. The metal plate 101 includes an upper surface 101A, and a lower surface 101B opposite to the upper surface 101A. The metal plate 101 is a member which ultimately becomes the lead frame 10. In other words, the upper surface 101A becomes the upper surface 10A of the lead frame 10, and the lower surface 101B becomes the lower surface 10B of the lead frame 10. The material used for the metal plate 101 may be copper (Cu), a Cu-based alloy, iron-nickel (Fe—Ni), a Fe-Ni-based alloy, stainless steel, or the like, for example.

Next, as illustrated in FIG. 5B, a photosensitive resist layer 111 is formed on the entire upper surface 101A of the metal plate 101, and a photosensitive resist layer 112 is formed on the entire lower surface 101B of the metal plate 101. The resist layers 111 and 112 may be formed by coating and drying a resist liquid, or by adhering a resist film, for example. For example, dry film resist, electrodeposition resist, or the like may be used for the resist layers 111 and 112.

Next, as illustrated in FIG. 5C, openings 111X and 111Y are famed in the resist layer 111 by exposing and developing the resist layer 111, and openings 112Y are formed in the resist layer 112 by exposing and developing the resist layer 112. The opening 111X is formed in an area where the recess 11 is to be formed. The openings 111Y and 112Y are formed in areas where through holes, separating the die pad 16 and the leads 17 from each other, are to be formed.

Figure 6A:
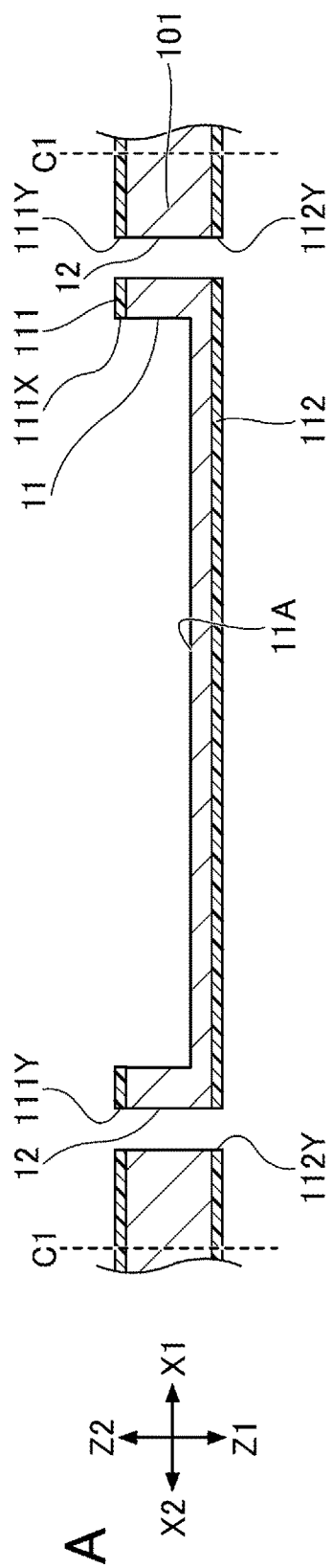
FIG. 6A, FIG. 6B, and FIG. 6C are cross sectional views (part 2) illustrating the method for manufacturing the semiconductor device according to the first embodiment.

Next, as illustrated in FIG. 6A, the metal plate 101 exposed inside the openings 111X and 111Y is half-etched from the upper surface 101A, and the metal plate 101 exposed inside the openings 112Y is half-etched from the lower surface 101B. Accordingly, the recess 11 is formed in the upper surface 101A, and a through hole 12, penetrating the metal plate 101, is formed in the metal plate 101. The recess 11 has the bottom surface 11A. When copper is used for the metal plate 101, a ferric chloride aqueous solution or a cupric chloride aqueous solution may be used as an etchant for half-etching the metal plate 101.

Figure 6B:
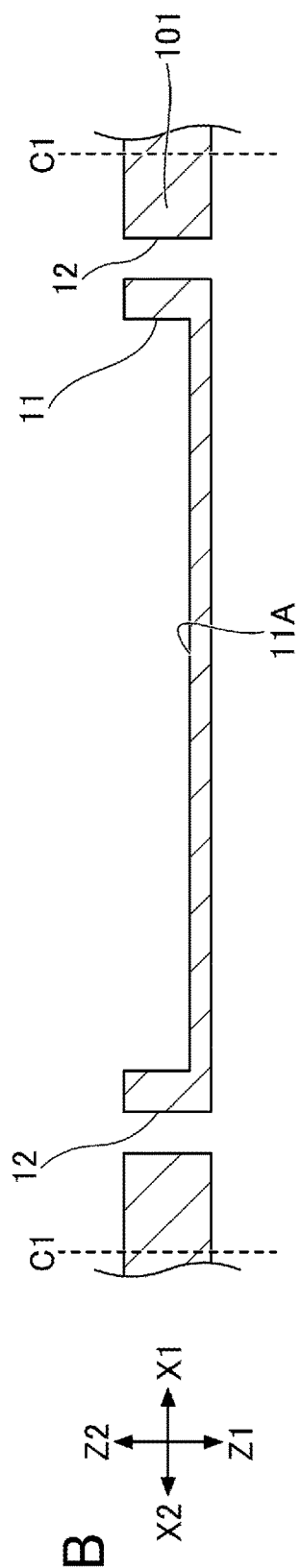

Next, as illustrated in FIG. 6B, the resist layers 111 and 112 are stripped using a stripping liquid.

Figure 6C:
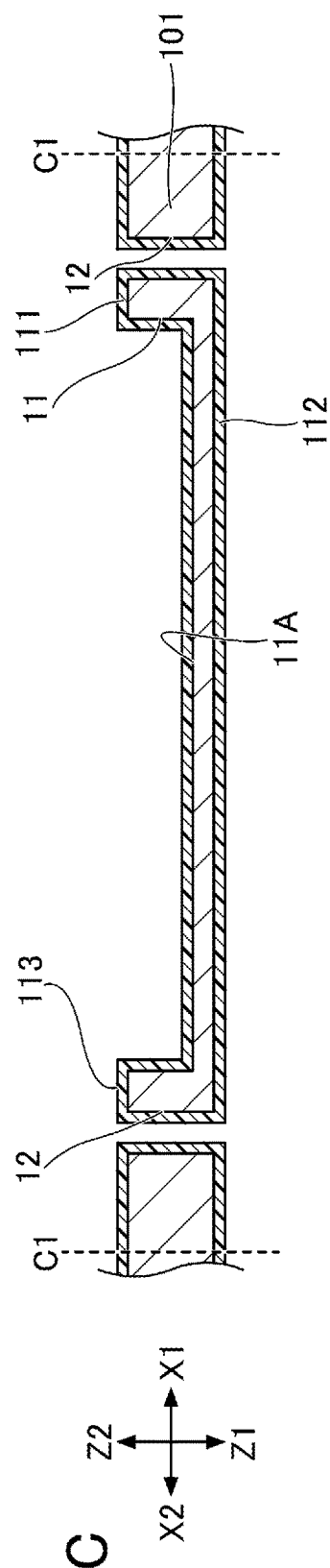

Next, as illustrated in FIG. 6C, a photosensitive plating resist layer 113 is formed on the upper surface 101A and the lower surface 101B of the metal plate 101, a sidewall surface and the bottom surface of the recess 11, and a sidewall surface of the through hole 12.

Figure 7A:
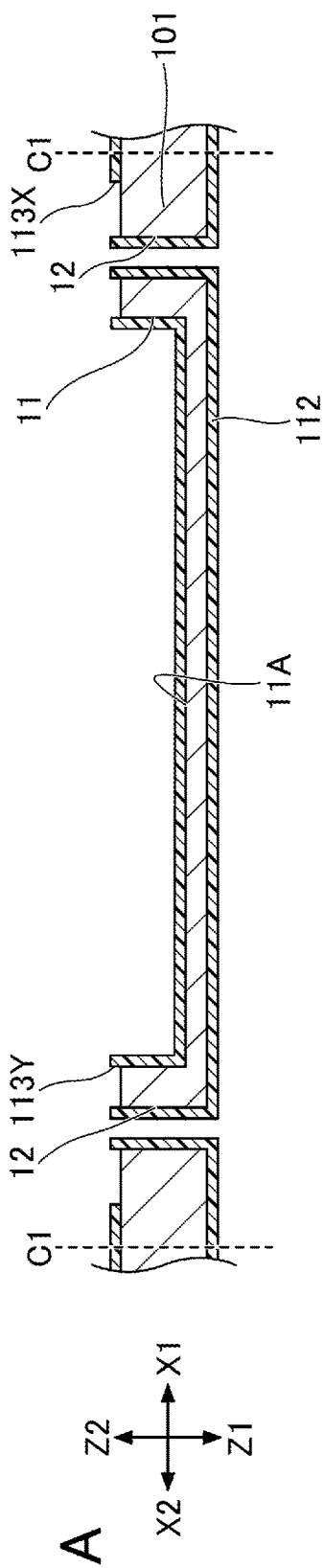
FIG. 7A, FIG. 7B, and FIG. 7C are cross sectional views (part 3) illustrating the method for manufacturing the semiconductor device according to the first embodiment.

Next, as illustrated in FIG. 7A, openings 113X and 113Y are famed in the plating resist layer 113 by exposing and developing the plating resist layer 113. The opening 113X is formed in an area where the metal film 13 is to be formed on the upper surface 101A. The opening 113Y is formed in an area where the metal film 14 is to be famed on the upper surface 101A.

Figure 7B:
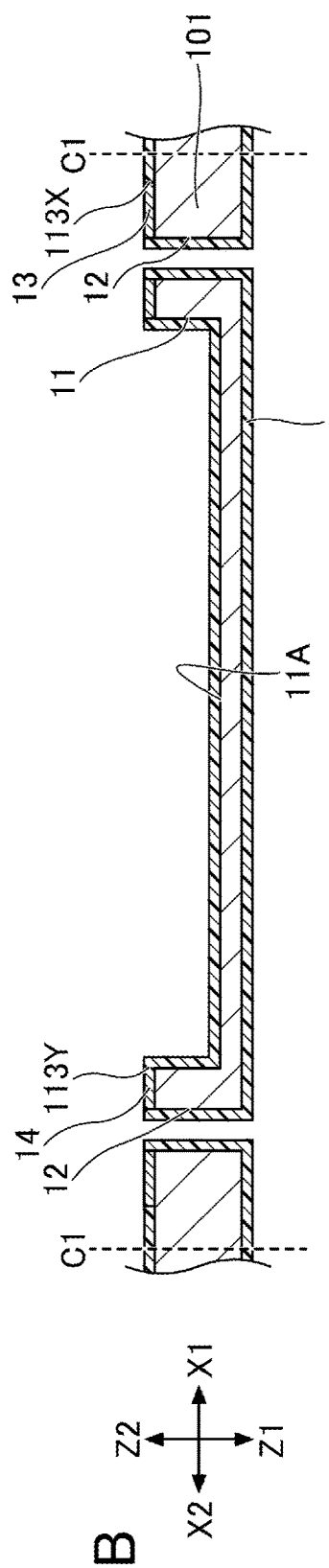

Next, as illustrated in FIG. 7B, the metal film 13 is formed inside the opening 113X, and the metal film 14 is formed inside the opening 113Y. The metal films 13 and 14 may be formed, by an electrolytic plating method using the metal plate 101 as a plating feed line, for example.

Figure 7C:
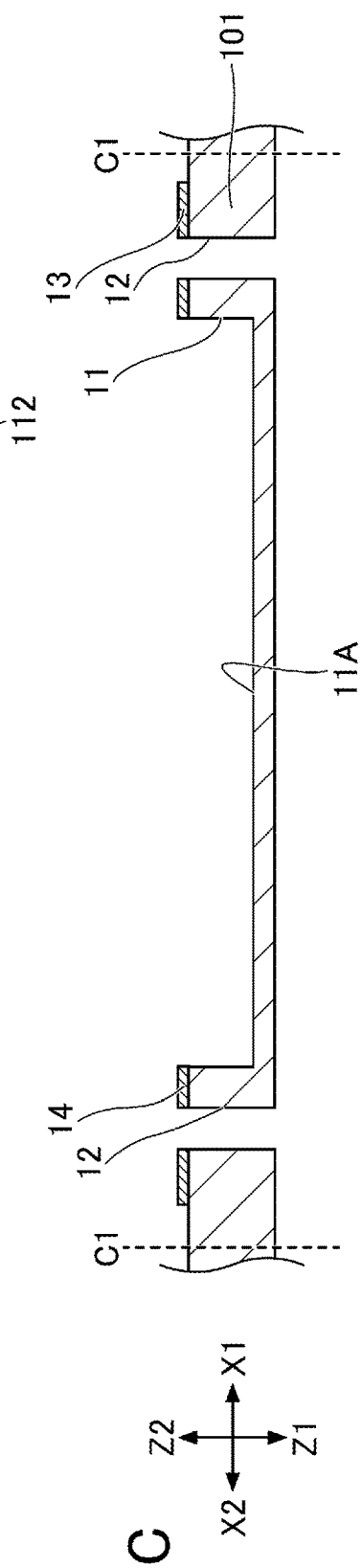

Next, as illustrated in FIG. 7C, the resist layer 113 is stripped using a stripping liquid.

The lead frame assembly 90 is formed by the processes described above.

Next, as illustrated in FIG. 8A, the relay board 20 is disposed in the recess 11. The relay board 20 is arranged so that the lower surface 20B opposes the bottom surface 11A of the recess 11. In this state, the bottom surface 11A and the lower surface 20B are bonded by the adhesive 61. Examples of the adhesive 61 include a die attach film, a Ag paste, or the like, for example.

Next, as illustrated in FIG. 8B, the first semiconductor chip 30 is provided on the relay board 20. The first semiconductor chip 30 has the electrode 31 provided on the upper surface thereof. In this state, the upper surface 20A of the relay board 20 and the lower surface of the first semiconductor chip 30 are bonded by the adhesive 62. Examples of the adhesive 62 include a die attach film, a Ag paste, or the like, for example.

Further, as illustrated in FIG. 8B, the second semiconductor chip 40 is provided on the first semiconductor chip 30. The second semiconductor chip 40 has the electrode 41 provided on the upper surface thereof. In this state, the upper surface of the first semiconductor chip 30 and the lower surface of the second semiconductor chip are bonded by the adhesive 63. Examples of the adhesive 63 include a die attach film, a Ag paste, or the like, for example.

Figure 9A:
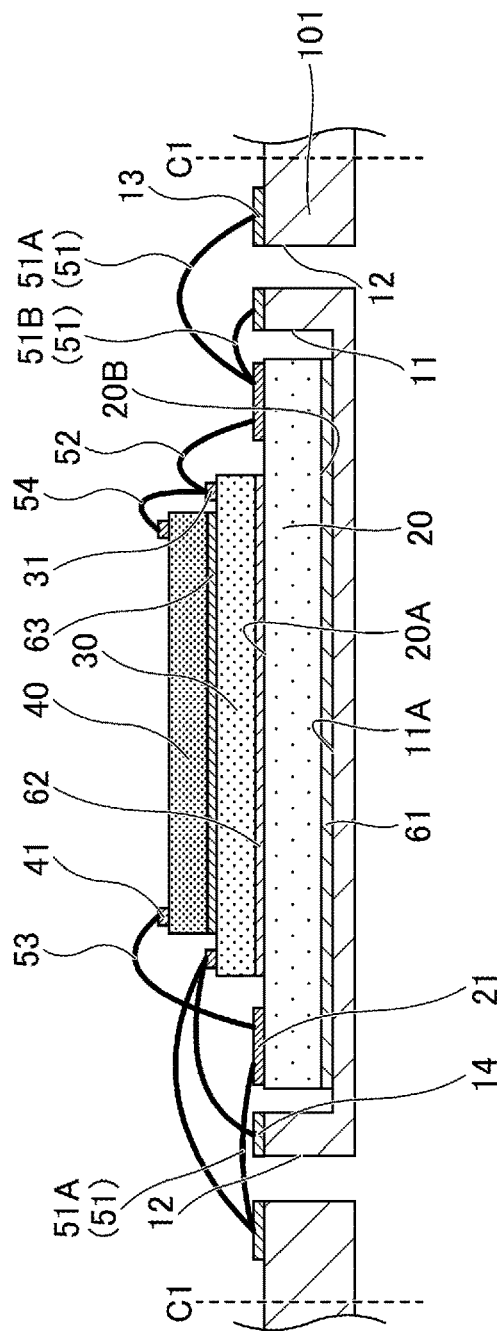
FIG. 9A and FIG. 9B are cross sectional views (part 5) illustrating the method for manufacturing the semiconductor device according to the first embodiment.

Next, as illustrated in FIG. 9A, the first bonding wire 51 (51A and 51B), the second bonding wire 52, the third bonding wire 53, and the fourth bonding wire 54 are formed. The first bonding wire 51 connects the metal film 13 or 14 of the lead frame assembly 90 to the interconnect 21 of the relay board 20. The second bonding wire 52 connects the interconnect 21 of the relay board 20 to the electrode 31 of the first semiconductor chip 30. The third bonding wire 53 connects the interconnect 21 of the relay board 20 to the electrode 41 of the second semiconductor chip 40. The fourth bonding wire 54 connects the electrode 31 of the first semiconductor chip 30 to the electrode 41 of the second semiconductor chip 40. A bonding wire may be additionally formed to connect the metal film 13 or 14 of the lead frame 10 to the electrode 31 of the first semiconductor chip 30.

Figure 9B:
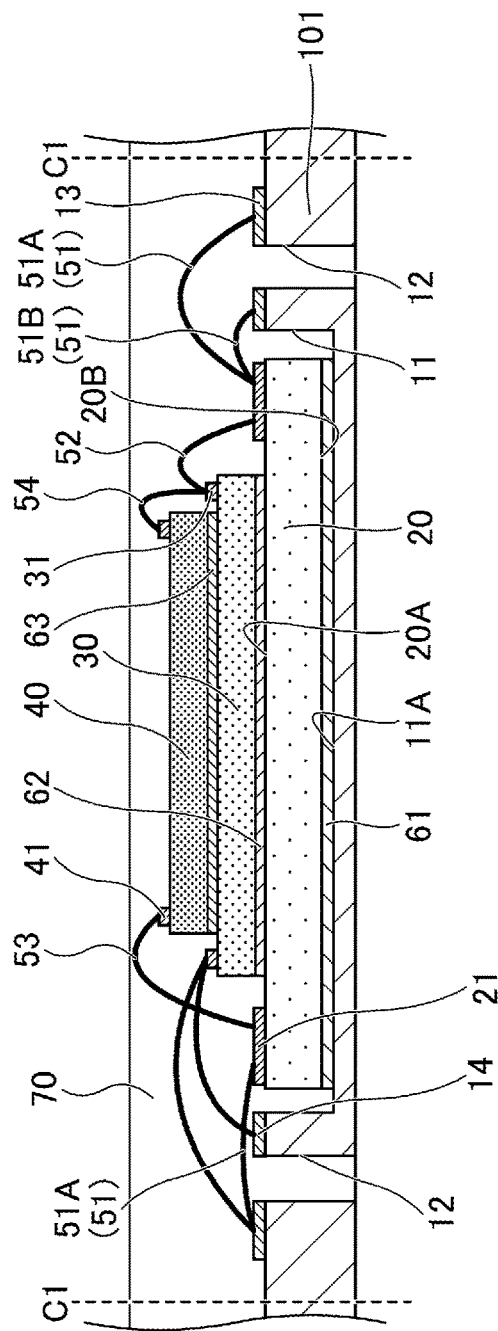

Next, as illustrated in FIG. 9B, the resin part 70 is formed to encapsulate the relay board 20, the first semiconductor chip 30, the second semiconductor chip 40, the first bonding wire 51, the second bonding wire 52, the third bonding wire 53, and the fourth bonding wire 54. The metal plate 101 is also encapsulated by the resin part 70, so that the lower surface 101B of the metal plate 101 is exposed at the lower surface of the resin part 70. For example, the metal plate 101 is encapsulated by the resin part 70, so that the lower surface 101B of the metal plate 101 coincides with the lower surface of the resin part 70. For example, the so-called molded resin or the like, having a filler included in an epoxy resin, may be used for the resin part 70. The resin part 70 may be formed by transfer molding, compression molding, or the like, for example.

Figure 10A:
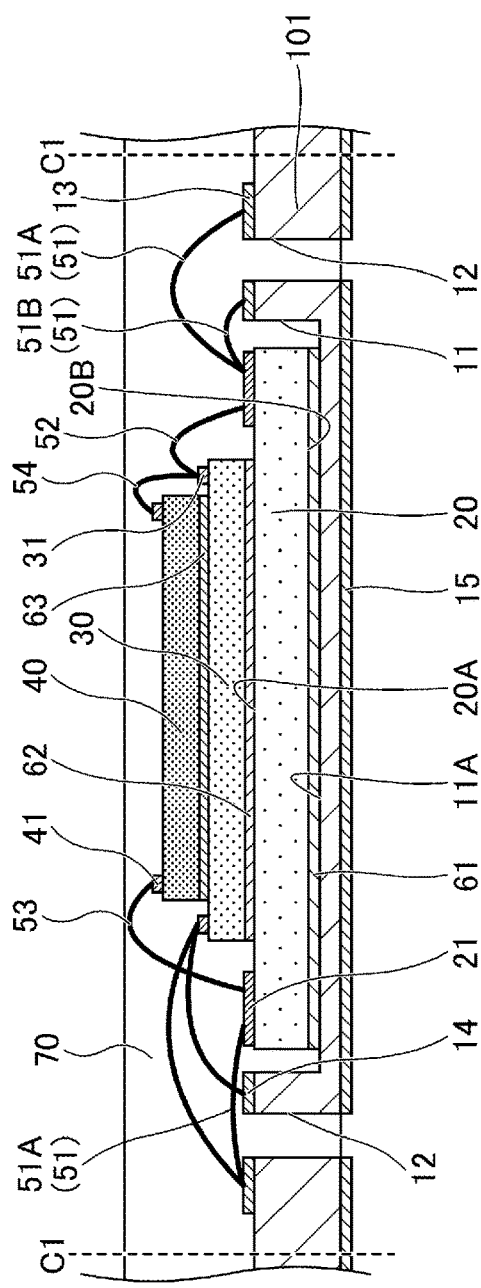
FIG. 10A and FIG. 10B are cross sectional views (part 6) illustrating the method for manufacturing the semiconductor device according to the first embodiment.

Next, as illustrated in FIG. 10A, the metal film 15 is formed on the lower surface 101B of the metal plate 101. The metal film 15 may be formed, by electrolytic plating using the metal plate 101 as a plating feed line, for example.

Figure 10B:
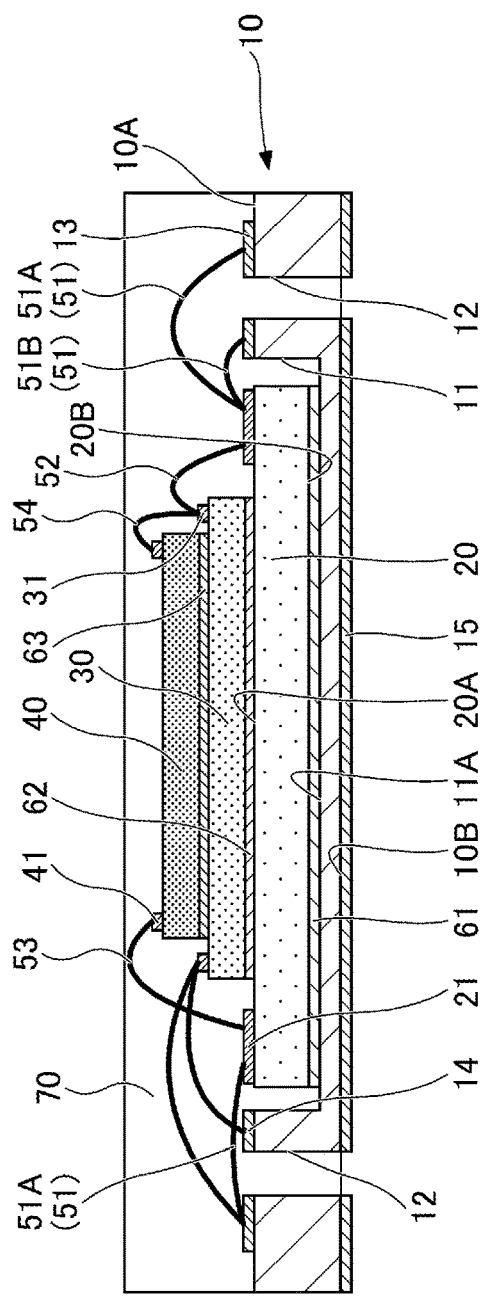

Next, as illustrated in FIG. 10B, the structure illustrated in FIG. 10A is cut along the cutting positions C1 and singulated, to complete the plurality of semiconductor devices 1. The lead frame 10 is obtained from the metal plate 101. The cutting may be performed by a slicer or the like, for example.

The semiconductor device 1 may be distributed as a single product, or the lead frame assembly 90 may be distributed as a single product. Further, a lead frame, having the relay board 20 mounted on the lead frame assembly 90 as illustrated in FIG. 8A, may be distributed as a single product.

Next, a method for forming a relay board 202 according to a second example will be described. FIG. 11A through FIG. 11D are cross sectional views illustrating the method for forming the relay board 202 according to the second example.

Figure 11A:
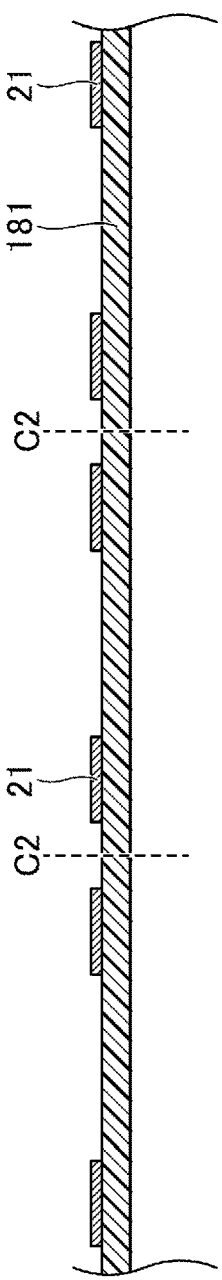
FIG. 11A, FIG. 11B, FIG. 11C, and FIG. 11D are cross sectional views illustrating a method for forming a relay board according to a second example.

First, as illustrated in FIG. 11A, a flexible base, such as a TAB tape, including a tape base assembly 181 and the interconnect 21, is prepared. A plurality of tape bases 81 are assembled on the tape base assembly 181, and the interconnect 21 is formed on an upper surface of the tape base assembly 181. The tape base assembly 181 is thereafter cut along cutting positions C2, to form the individual tape bases 81.

Figure 11B:
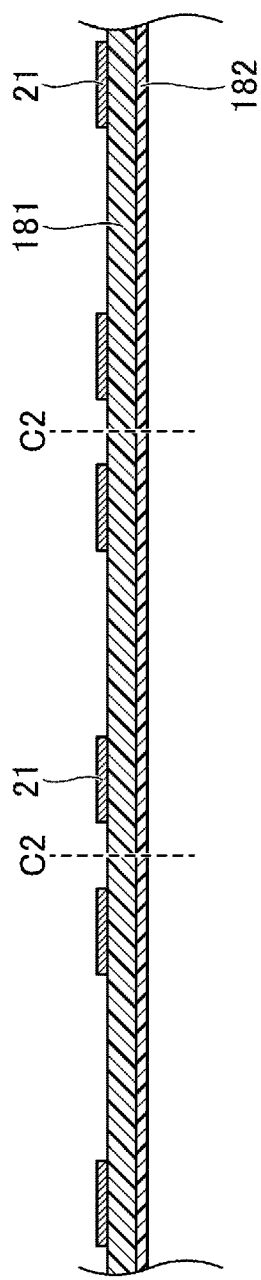

Next, as illustrated in FIG. 11B, an adhesive layer 182 is formed on a lower surface of the tape base assembly 181.

Figure 11C:
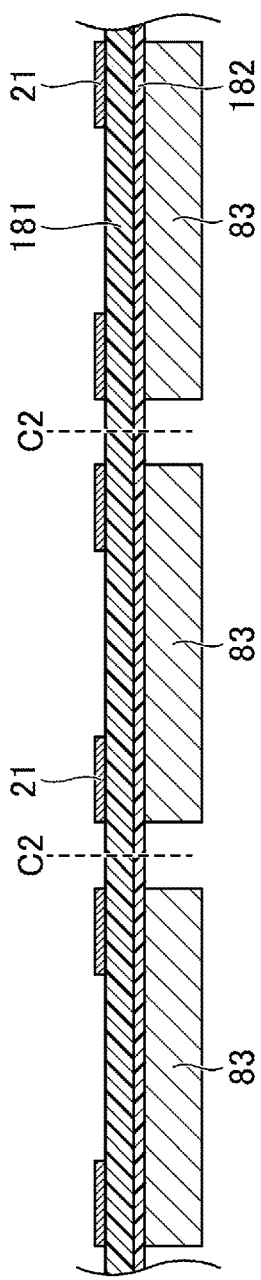

Next, as illustrated in FIG. 11C, a carrier 83 is adhered to the adhesive layer 182, for each region forming the tape base 81 of the tape base assembly 181.

Figure 11D:
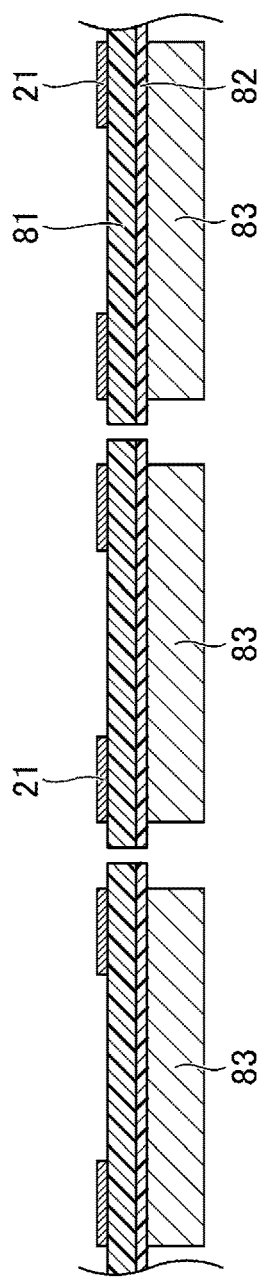

Next, as illustrated in FIG. 11D, a plurality of relay boards 202 is completed by cutting and singulating the structure illustrated in FIG. 11C along the cutting positions C2. The tape base 81 is obtained from the tape base assembly 181, and an adhesive layer 82 is obtained from the adhesive layer 182.

In the process illustrated in FIG. 11C, the carrier 83 is attached to each region forming the tape base 81, however, one carrier assembly formed by an assembly of the carriers 83 may be adhered, and the structure including the carrier assembly may be cut along the cutting positions C2 in the process illustrated in FIG. 11D. If the carrier assembly is made of a metal, metal burr may be generated when cutting the carrier assembly, and cutting residue of the metal may adhere to the side surface of the tape base 81. In such cases, the carrier 83 and the interconnect 21 may be short-circuited by the metal burr or the cutting residue of the metal. For this reason, when the carrier 83 is made of the metal, the carrier 83 is preferably prepared for each region which becomes the tape base 81, and no metal cutting is performed, in order to prevent the deterioration of insulation reliability. In this case, the carrier 83 is consequently positioned on the inner side of the edge of the tape base 81 in the plan view.

Second Embodiment

Figure 12:
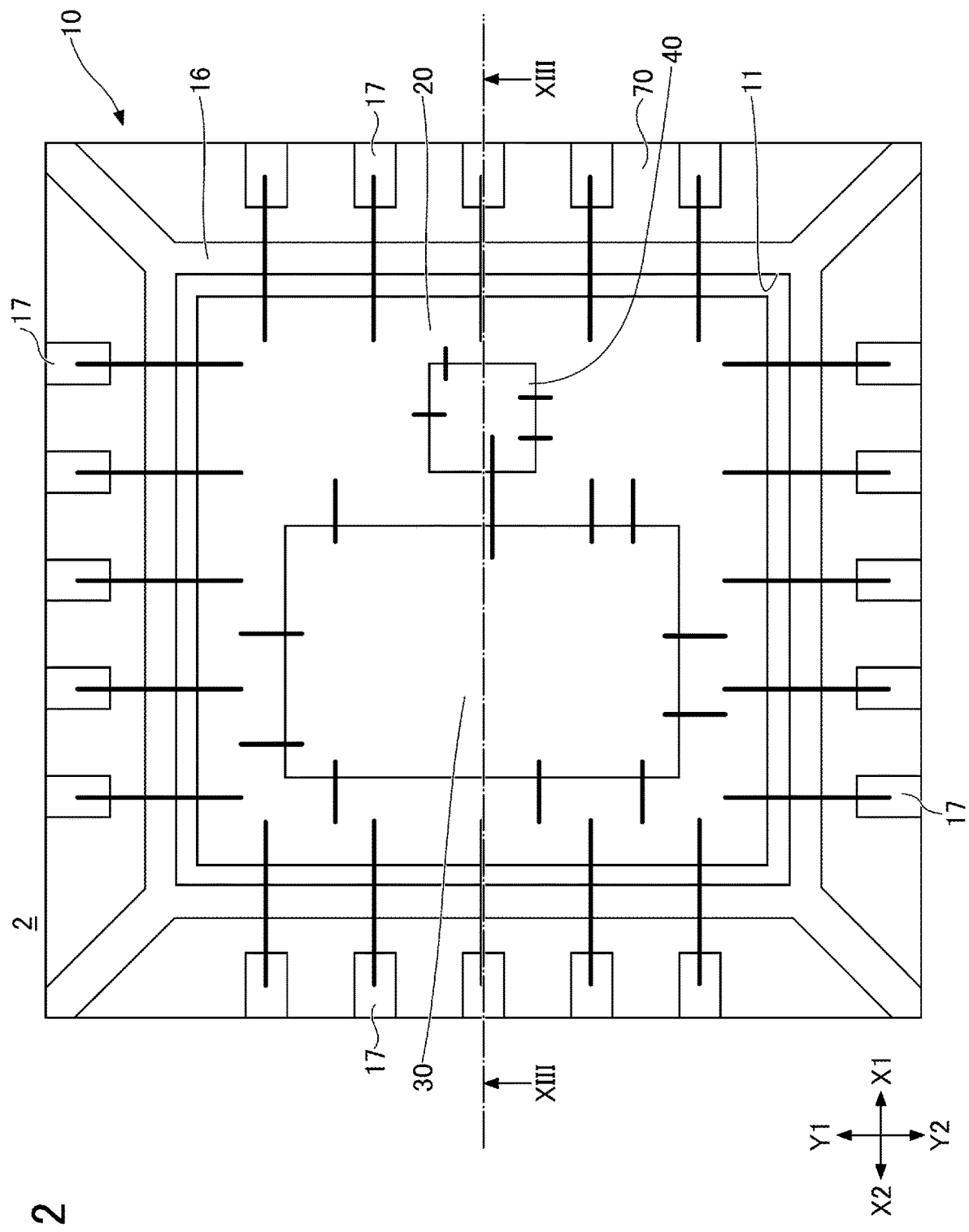
FIG. 12 is a diagram schematically illustrating the semiconductor device according to a second embodiment.
Figure 13:
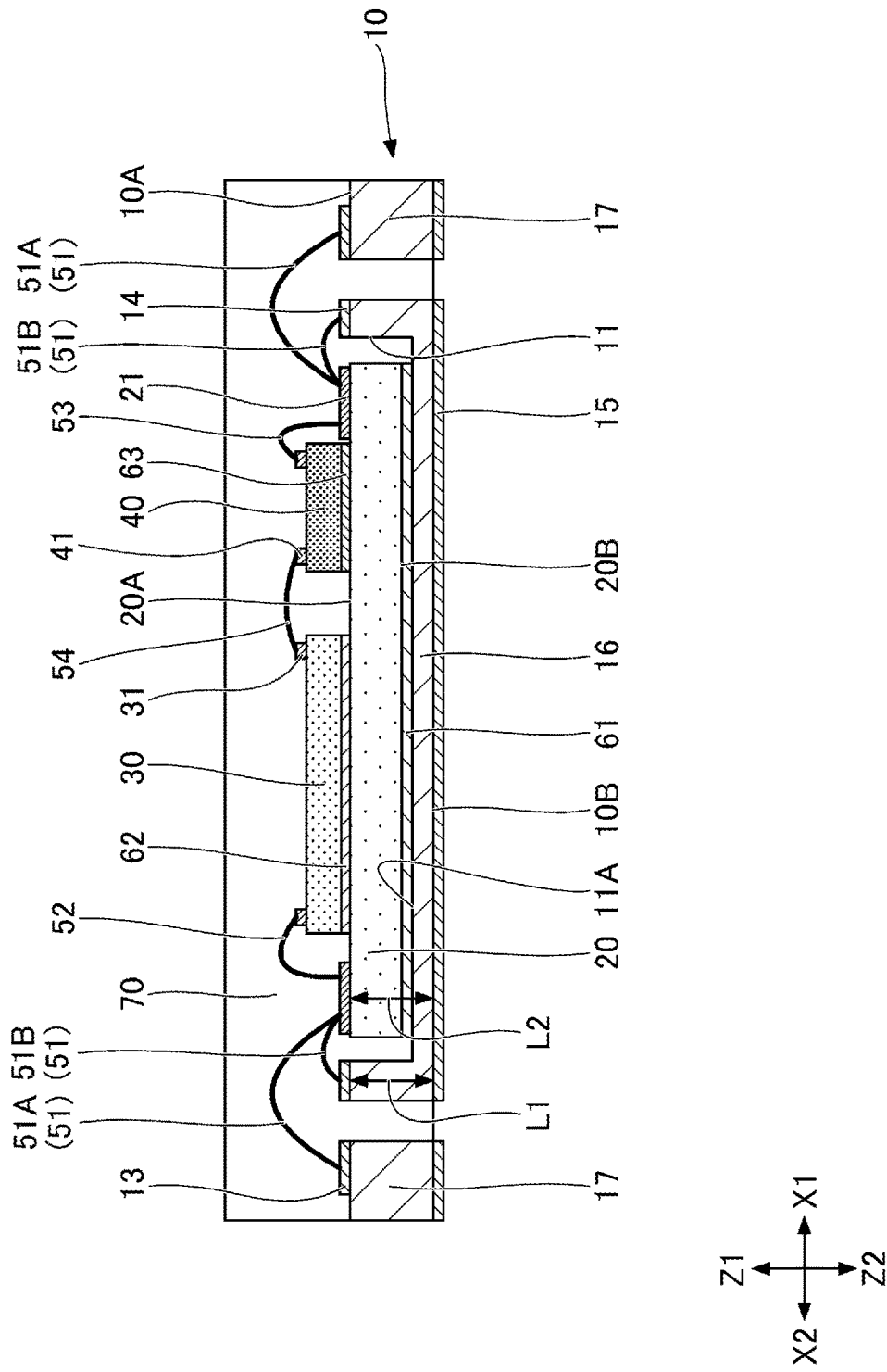
FIG. 13 is a cross sectional view illustrating the semiconductor device according to the second embodiment.

Next, a second embodiment will be described. The second embodiment differs from the first embodiment, mainly in the arrangement of the first semiconductor chip and the second semiconductor chip. FIG. 12 is a diagram schematically illustrating the semiconductor device according to the second embodiment. FIG. 13 is a cross sectional view illustrating the semiconductor device according to the second embodiment. FIG. 13 is a cross sectional view along a line XIII-XIII in FIG. 12. FIG. 12 illustrates the lead frame 10, the relay board 20, the first semiconductor chip 30, the second semiconductor chip 40, or the like in a perspective through the resin part 70. In FIG. 12, the illustration of the interconnect 21 or the like is omitted.

As illustrated in FIG. 12 and FIG. 13, in a semiconductor device 2 according to the second embodiment, the second semiconductor chip 40 is provided on the relay board 20, adjacent to the first semiconductor chip 30. In other words, the first semiconductor chip 30 and the second semiconductor chip 40 are arranged side by side on the relay board 20. The upper surface 20A of the relay board 20 and the lower surface of the second semiconductor chip 40 are bonded by the adhesive 63.

The semiconductor device 2 includes the first bonding wire 51, the second bonding wire 52, the third bonding wire 53, and the fourth bonding wire 54. The first bonding wire 51 connects the metal film 13 or 14 of the lead frame 10 to the interconnect 21 of the relay board 20. The second bonding wire 52 connects the interconnect 21 of the relay board 20 to the electrodes 31 of the first semiconductor chip 30. The third bonding wire 53 connects the interconnect 21 of the relay board 20 to the electrode 41 of the second semiconductor chip 40. The fourth bonding wire 54 connects the electrode 31 of the first semiconductor chip 30 to the electrode 41 of the second semiconductor chip 40.

The structure of other portions of the second embodiment are similar to those of the first embodiment.

For example, in the plan view, the lead frame 10 may include the rectangular die pad 16, and the plurality of leads 17 disposed around the die pad 16. For example, the planar shape of the lead 17 may be rectangular, and the lead 17 may have a cubic shape or a parallelepiped shape. The lower surface of die pad 16 coincides with the lower surface of lead 17. The lower surface of die pad 16 and the lower surfaces of leads 17 form the lower surface 10B of lead frame 10. In addition, the recess 11 is formed in the upper surface of the die pad 16. The portion of the upper surface of the die pad 16, not formed with the recess 11, coincides with the upper surfaces of the leads 17. The portion of the upper surface of the die pad 16, not formed with the recess 11, and the upper surfaces of the leads 17, form the upper surface 10A of the lead frame 10.

The lower surface of the die pad 16 coincides with the lower surface of the resin part 70, and the lower surface of the die pad 16 is exposed at the lower surface of the resin part 70. In addition, the upper and side surfaces of the die pad 16 are covered by resin part 70.

The lower surfaces of the leads 17 coincide with the lower surface of the resin part 70, and the lower surfaces of the leads 17 are exposed at the lower surface of the resin part 70. In addition, the upper surfaces of the leads 17 are covered by a resin part 70. The first side surface of the lead 17 opposing the die pad 16 is covered by the resin part 70, and the second side surface of the lead 17, opposite to the first side surface, is exposed at the side surface of the resin part 70. Further, the side surface of the lead 17, between the first side surface of the lead 17 opposing the die pad 16, and the second side surface of the lead 17, is covered by the resin part 70.

In the second embodiment, short bonding wires may also be used for the bonding wires 51 through 54. For example, in this second embodiment, because the distance L2 is less than or equal to the distance L1, the movement of the first bonding wire 51 can be restricted and reduced. In addition, the lead frame 10 and the second semiconductor chip 40 may also be connected to each other via the first bonding wire 51, the interconnect 21, and the third bonding wire 53, even if the first semiconductor chip 30 is positioned between the second semiconductor chip 40 and the lead 17 which is electrically connected to the electrode 41 of the second semiconductor chip 40. That is, there is no need for a bonding wire which crosses over the first semiconductor chip 30 and thus tends to become long, and the short circuit generated inside the semiconductor device 2 can be reduced with ease.

Third Embodiment

Figure 14:
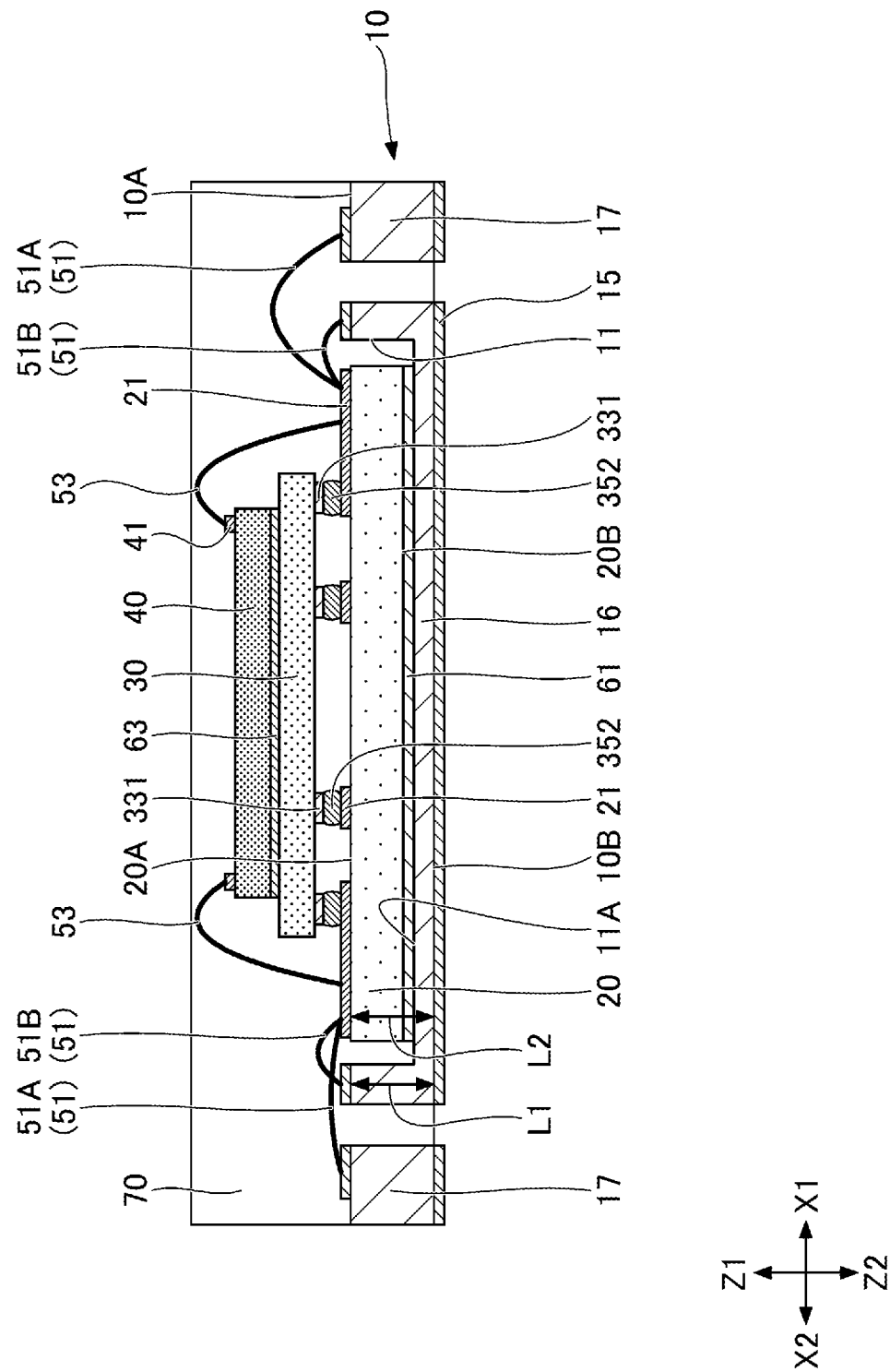
FIG. 14 is a cross sectional view illustrating the semiconductor device according to a third embodiment.

Next, a third embodiment will be described. The third embodiment differs from the first embodiment, mainly in the mounting of the first semiconductor chip. FIG. 14 is a cross sectional view illustrating a semiconductor device according to the third embodiment.

As illustrated in FIG. 14, in a semiconductor device 3 according to the third embodiment, the first semiconductor chip 30 includes an electrode 331 in place of the electrode 31. The first semiconductor chip 30 is mounted on the relay board 20, so that the surface of the first semiconductor chip 30, formed with the electrode 331, opposes the upper surface 20A of the relay board 20. That is, the first semiconductor chip 30 is flip-chip bonded onto the relay board 20. A conductive bump 352 is provided between the interconnect 21 and the electrode 331, and the interconnect 21 and the electrode 331 are connected to each other by the conductive bump 352. The conductive bump 352 is an example of the second conductive material. The conductive bump 352 may be a solder bump, for example.

The second semiconductor chip 40 is provided on the surface of the first semiconductor chip 30, opposite to the surface famed with the electrodes 331. The first semiconductor chip 30 and the second semiconductor chip 40 are bonded by the adhesive 63.

Similar to the first embodiment, the semiconductor device 3 includes the first bonding wire 51, and the third bonding wire 53. The second bonding wire 52, connecting the interconnect 21 of the relay board 20 to the electrode 31 of the first semiconductor chip 30, is not required. The fourth bonding wire 54, connecting the electrode 31 of the first semiconductor chip 30 to the electrode 41 of the second semiconductor chip 40, is also not required.

The structure of other portions of the third embodiment are similar to those of the first embodiment.

For example, in the plan view, the lead frame 10 includes the rectangular die pad 16, and the plurality of leads 17 disposed around the die pad 16. For example, the planar shape of the lead 17 may be rectangular, and the lead 17 may have a cubic shape or a parallelepiped shape. The lower surface of die pad 16 coincides with the lower surfaces of leads 17. The lower surface of die pad 16 and the lower surfaces of leads 17 form the lower surface 10B of lead frame 10. In addition, the recess 11 is formed in the upper surface of the die pad 16. The portion of the upper surface of the die pad 16, not formed with the recess 11, coincides with the upper surfaces of the leads 17. The portion of the upper surface of the die pad 16, not formed with the recess 11, and the upper surfaces of the leads 17, form the upper surface 10A of the lead frame 10.

The lower surface of the die pad 16 coincides with the lower surface of the resin part 70, and the lower surface of the die pad 16 is exposed at the lower surface of the resin part 70. In addition, the upper and side surfaces of the die pad 16 are covered by resin part 70.

The lower surfaces of the leads 17 coincide with the lower surface of the resin part 70, and the lower surfaces of the leads 17 are exposed at the lower surface of the resin part 70. Moreover, the upper surfaces of the leads 17 are covered by the resin part 70. The first side surface of the lead 17 opposing the die pad 16 is covered by the resin part 70, and the second side surface of the lead 17, opposite to the first side surface, is exposed at the side surface of the resin part 70. Further, the side surface of the lead 17, between the first side surface of the lead 17 opposing the die pad 16, and the second side surface of the lead 17, is covered by the resin part 70.

In the third embodiment, short bonding wires may also be used for the bonding wires 51 and 53. For example, in this second embodiment, because the distance L2 is less than or equal to the distance L1, the movement of the first bonding wire 51 can be restricted and reduced. If the lead frame 10 and the second semiconductor chip 40 are connected by a single bonding wire, the bonding wire is likely to become long. However, in the third embodiment, the lead frame 10 and the second semiconductor chip 40 can be connected to each other via the first bonding wire 51, the interconnect 21, and the third bonding wire 53. For this reason, there is no need to use a bonding wire which is likely to become long, and the short circuit generated inside the semiconductor device 3 can be reduced with ease.

Accordingly to each of the embodiments described above, it is possible to provide a semiconductor device which can reduce a short circuit generated inside, and to provide a method for manufacturing such a semiconductor device.

Various aspects of the subject-matter described herein may be set out non-exhaustively in the following numbered clauses:

1. A method for manufacturing a semiconductor device, comprising:
    creating a lead frame having a first principal surface which includes a recess, and a second principal surface opposite to the first principal surface;
    disposing, in the recess, a relay board having a third principal surface, and a fourth principal surface opposite to the third principal surface, so that the fourth principal surface opposes a bottom surface of the recess;
    providing a first semiconductor chip on the third principal surface;
    providing a first conductive material connecting the lead frame and the relay board; and
    providing a second conductive material connecting the relay board and the first semiconductor chip,
    wherein a distance between the second principal surface and the third principal surface is less than or equal to a distance between the second principal surface and the first principal surface.

2. The method for manufacturing the semiconductor device according to clause 1, further comprising:
    providing a second semiconductor chip above the third principal surface; and
    providing a third conductive material connecting the relay board and the second semiconductor chip.

3. The method for manufacturing the semiconductor device according to clause 2, further comprising:
    providing a fourth conductive material connecting the first semiconductor chip and the second semiconductor chip.

4. The method for manufacturing the semiconductor device according to clause 2, wherein the providing the second semiconductor chip disposes the second semiconductor chip on the first semiconductor chip.

5. The method for manufacturing the semiconductor device according to clause 2, wherein the providing the second semiconductor chip disposes the second semiconductor chip on the relay board, adjacent to the first semiconductor chip.

Although the embodiments are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a lead frame having a first principal surface which includes a recess, and a second principal surface opposite to the first principal surface;
a relay board, disposed in the recess, and having a third principal surface, and a fourth principal surface opposite to the third principal surface and bonded to a surface of the lead frame forming a bottom of the recess;
a first semiconductor chip disposed on the third principal surface;
a first conductive material electrically connecting the lead frame and the relay board; and
a second conductive material electrically connecting the relay board and the first semiconductor chip,
wherein a distance between the second principal surface and the third principal surface is less than or equal to a distance between the second principal surface and the first principal surface.

2. The semiconductor device as claimed in claim 1, wherein
the first conductive material is a bonding wire, and
the second conductive material is a bonding wire or a conductive bump.

3. The semiconductor device as claimed in claim 1, further comprising:
a second semiconductor chip disposed above the third principal surface; and
a third conductive material electrically connecting the relay board and the second semiconductor chip.

4. The semiconductor device as claimed in claim 3, wherein the third conductive material is a bonding wire.

5. The semiconductor device as claimed in claim 3, further comprising:
a fourth conductive material electrically connecting the first semiconductor chip and the second semiconductor chip.

6. The semiconductor device as claimed in claim 3, wherein the second semiconductor chip is disposed on the first semiconductor chip.

7. The semiconductor device as claimed in claim 3, wherein the second semiconductor chip is disposed on the relay board, adjacent to the first semiconductor chip.

8. The semiconductor device as claimed in claim 1, wherein the relay board includes a wiring board.

9. The semiconductor device as claimed in claim 1, wherein the relay board includes a bendable wiring board.

10. The semiconductor device as claimed in claim 1, wherein the fourth principal surface of the relay board is bonded to the surface of the lead frame forming the bottom of the recess by an adhesive.

11. The semiconductor device as claimed in claim 1, wherein
the lead frame includes a die pad, and a plurality of leads disposed around the die pad in a plan view,
the recess is formed in a first surface of the die pad, and
the first surface of the die pad coincides with the first principal surface of the lead frame.

12. The semiconductor device as claimed in claim 11, wherein a portion of the first surface of the die pad, excluding the recess, and a first surface of each of the plurality of leads, coincide with the first principal surface of the lead frame.

13. The semiconductor device as claimed in claim 12, wherein the lead frame further includes
a first metal film formed on the portion of the first surface of the die pad, excluding the recess, and
a second metal film formed on the first surface of each of the plurality of leads, and
the first conductive material is electrically connected to the first metal film and the second metal film.

14. The semiconductor device as claimed in claim 11, wherein a second surface of the die pad, opposite to the first surface of the die pad, and a second surface of each of the plurality of leads, opposite to the first surface of each of the plurality of leads, coincide with the second principal surface of the lead frame.

15. The semiconductor device as claimed in claim 14, wherein the lead frame further includes a metal film formed on the second surface of the die pad and on the second surface of each of the plurality of leads.

16. The semiconductor device as claimed in claim 1, further comprising:
a resin part configured to encapsulate the lead frame, the relay board, the first semiconductor chip, the first conductive material, and the second conductive material.

17. The semiconductor device as claimed in claim 16, wherein
the second principal surface of the lead frame is exposed at a lower surface of the resin part, and
a side surface of the lead frame is exposed at a side surface of the resin part.

18. The semiconductor device as claimed in claim 16, wherein
the lead frame includes a die pad, and a plurality of leads disposed around the die pad in a plan view,
a lower surface of the resin part coincides with a lower surface of the die pad, and with a lower surface of each of the plurality of leads, and
a side surface of the resin part coincides with a side surface of each of the plurality of leads.

19. The semiconductor device as claimed in claim 16, wherein
the fourth principal surface of the relay board is bonded, via an adhesive, to the surface of the lead frame forming the bottom of the recess, and
the resin part fills a gap between a sidewall surface of the recess, and each of a side surface of the relay board and a side surface of the adhesive.

20. The semiconductor device as claimed in claim 1, wherein the relay board includes
a metal carrier, and
a wiring board disposed on the metal carrier.

* * * * *